US006201301B1

(12) United States Patent
Hoang

(10) Patent No.: US 6,201,301 B1
(45) Date of Patent: Mar. 13, 2001

(54) LOW COST THERMALLY ENHANCED FLIP CHIP BGA

(75) Inventor: Lan H. Hoang, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/010,414

(22) Filed: Jan. 21, 1998

(51) Int. Cl.[7] .................................................. H01L 23/34
(52) U.S. Cl. ........................... 257/712; 257/737; 257/778
(58) Field of Search .................................... 237/778, 737, 237/738, 787; 257/778, 737, 738, 787, 712

(56) References Cited

U.S. PATENT DOCUMENTS

| 5,074,947 | 12/1991 | Estes et al. .................. 156/307.3 |
| 5,172,301 | 12/1992 | Schneider ....................... 361/386 |
| 5,175,612 | 12/1992 | Long et al. ..................... 257/667 |
| 5,311,060 | 5/1994 | Rostoker et al. ................. 257/796 |
| 5,386,144 | 1/1995 | Variot et al. ................... 257/718 |
| 5,399,898 | 3/1995 | Rostoker ........................ 257/499 |
| 5,409,863 | 4/1995 | Newman ......................... 437/209 |
| 5,410,805 | 5/1995 | Pasch et al. ...................... 29/830 |
| 5,410,806 | 5/1995 | Schneider ........................ 29/840 |
| 5,463,529 | 10/1995 | Chia et al. ...................... 361/704 |
| 5,466,635 | 11/1995 | Lynch et al. .................... 437/183 |
| 5,500,555 | 3/1996 | Ley ............................. 257/700 |
| 5,514,327 | 5/1996 | Schneider ........................ 419/36 |
| 5,527,743 | 6/1996 | Variot .......................... 437/216 |
| 5,537,342 | 7/1996 | Gainey .......................... 361/705 |
| 5,552,634 | 9/1996 | Schneider ....................... 257/706 |
| 5,568,683 | 10/1996 | Chia et al. ....................... 29/832 |
| 5,570,272 | 10/1996 | Variot .......................... 361/723 |
| 5,572,069 | 11/1996 | Schneider ....................... 257/690 |
| 5,621,616 | 4/1997 | Owens et al. .................... 361/704 |
| 5,635,244 | 6/1997 | Mayeda et al. ................. 427/248.1 |
| 5,637,920 | 6/1997 | Loo ............................. 257/700 |
| 5,663,872 | 9/1997 | Gainey .......................... 361/818 |
| 5,700,723 | 12/1997 | Barber .......................... 437/214 |
| 5,869,886 | 2/1999 | Tokuno .......................... 257/778 |
| 6,002,163 | * 12/1999 | Wojnarowski .................... 257/778 |

OTHER PUBLICATIONS

"Flip Chip Technology—A Review", a report submitted to Mr. George Westby and Peter Borgesen, Ph.D., by Chien–Yi Huang and K. Srihari, Phd., Department of Systems Science and Industrial Engineering State University of New York, Binghamton, New York, Nov. 1994, (48 pages) BGA/DCA Consortium—Advanced Technology.

(List continued on next page.)

Primary Examiner—Roy Potter
(74) Attorney, Agent, or Firm—Akin, Gump, Strauss, Hauer, & Feld L.L.P.

(57) ABSTRACT

An electronic device or flip chip includes a chip having an active side and an opposed side, with the active side electrically connected by bumps with the top of a substrate. A first material or underfill, generally located between the chip and the substrate, is resistive to electrical conductivity to isolate the flip chip bumps and their contacts. A second electrically conductive material is formed on a portion of the top of the substrate, the opposed side of the chip and over the first material to completely cover and protect the opposed side. The second material preferably has 80–95% metal fillers and is at least 75 microns (0.075 millimeters) thick. The second thermally/electrically conductive material transfers heat from the opposed or back side of the chip to provide a low cost flip chip package with comparable thermal performance to a flip chip with a heat spreader and a stiffener. Savings in cost of materials and processing is achieved by the elimination of at least the heat spreader and, when desired, the stiffener.

17 Claims, 2 Drawing Sheets

OTHER PUBLICATIONS

"Fabrication and Assembly Processes for Solderless Flip Chip Assemblies", Richard H. Estes, Epoxy Technology, ISHM '92 Proceedings (pp. 322–335)(Refers to above U.S. Patent No. 5,074,947).

Ball Grid Array Technology, by John H. Lau, Copyright ©1995 McGraw–Hill, Inc. including 3.5—Fabrication Process, pp. 105–108; 5.3—CBGA/CCGA Module Assembly, pp. 136–141; and 18.5—Production Equipment, pp. 548–551. (16 total pages).

Ablestik Electronic Materials & Adhesives, a subsidiary of National Starch and Chemical Company, including "ABLE-BOND" die attach adhesive, Copyright ©1997, (4 total pages).

Electronic Design–Technology ● Applications ● Products ● Solutions, Dec. 15, 1997; Thermal Pad Raises SMD Power–Handling Capability (3 total pages).

Amkor/Anam PBGA Family, Plastic Ball Grid Array (PBGA)(3 pages) Amkor/Anam; BGA Family, Amkor/Anam BGA Family Overview (2 pages); Amkor/Anam MCM/PBGA, Amkor/Anam's MCM/PBGA Packages (3 pages); Amkor/Anam SBGA, SuperBgA® (SBGA) Packages (3 pages); Amkor/Anam fleXBGA Family, fleXBGA Packages (3 pages); Amkor Electronics, the company, (2 pages); Amkor Technology company news (4 pages).

* cited by examiner-

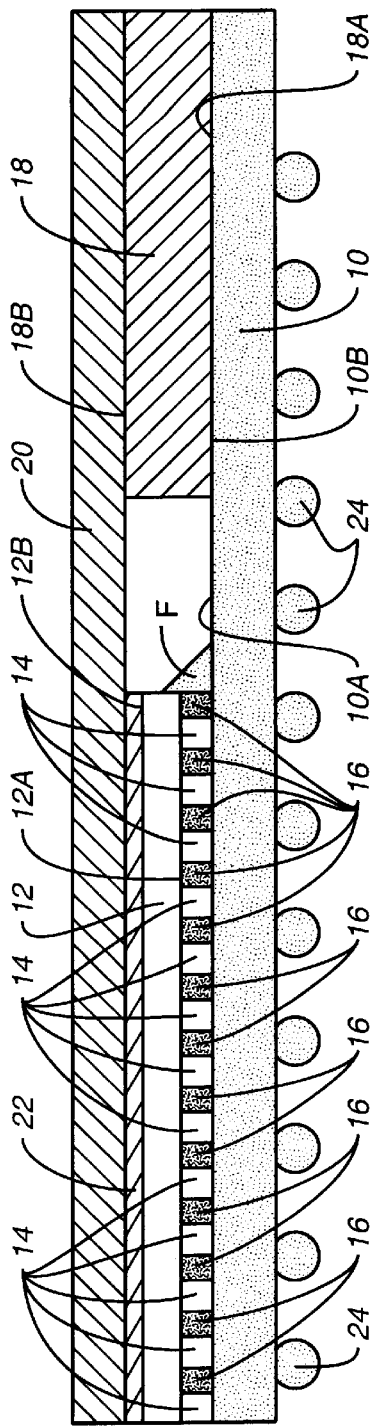
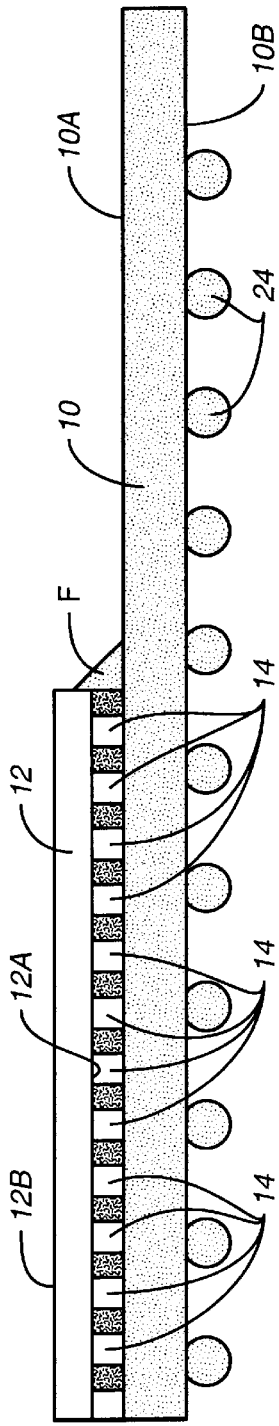
FIG._1
*(PRIOR ART)*
FIG._2
*(PRIOR ART)*

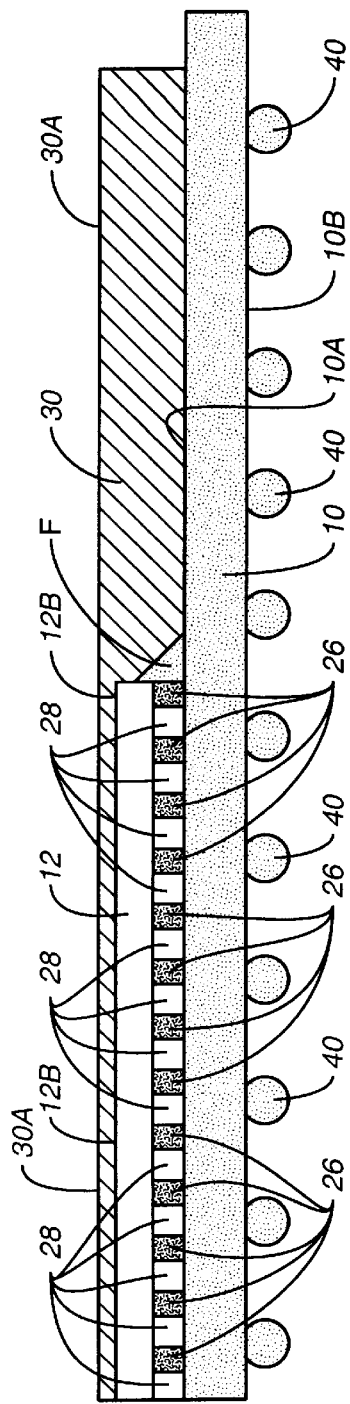
FIG._3
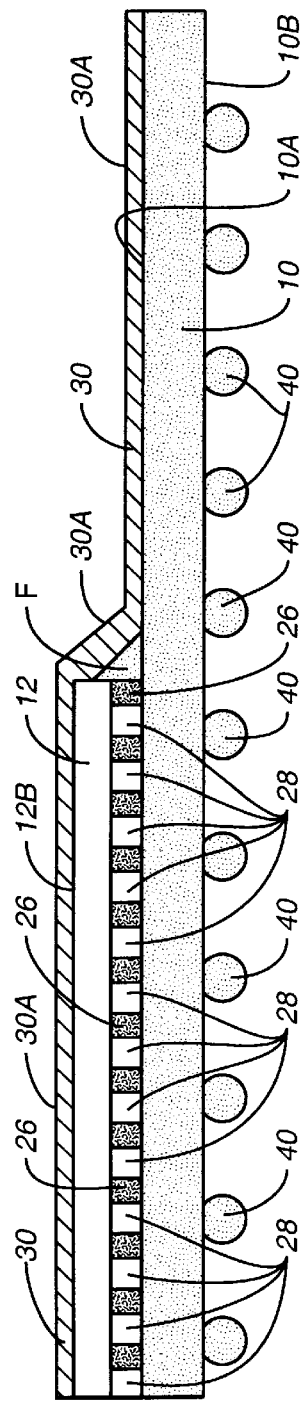
FIG._4
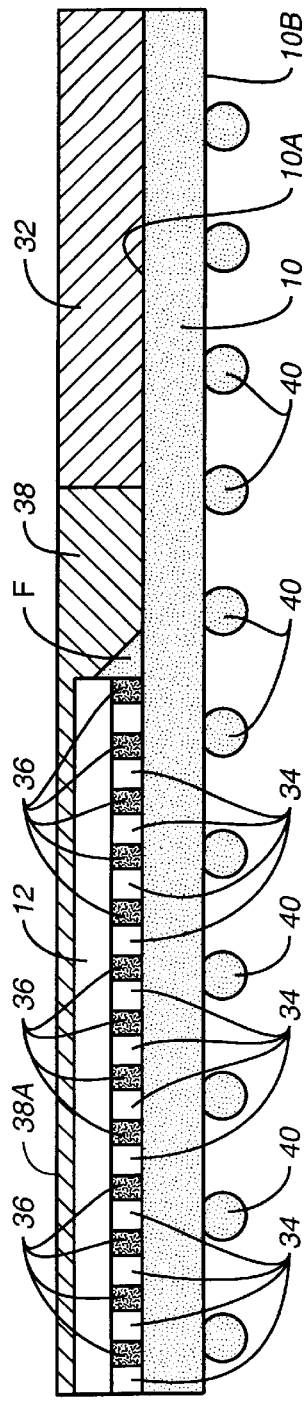
FIG._5

LOW COST THERMALLY ENHANCED FLIP CHIP BGA

BACKGROUND OF THE INVENTION

1. Field of the Invention

This invention relates to a low cost flip chip ball grid array (FCBGA) and, in particular, a low cost flip chip package with enhanced thermal performance.

2. Description of Related Art

As computer buses grow to 64 and 128 bits wide to support increased system performance, lead count requirements increase even more dramatically. New devices for networking and computer applications are approaching lead counts in the 750–1100 range, at frequency of 200-MHz and higher. Flip chip interconnection technology, which spreads the pins or bumps over the entire surface of the chip, instead of conventional arrangements on the edges of the chip only, is the most cost effective solution for these new, high density lead count requirements. In addition to increasing the number of connections to a chip, flip chip interconnection technology also enables power and ground contacts to be placed in optimal locations for maximum electrical performance.

In flip chip interconnection technology, the primary heat dissipation path is off the back or opposed side to the active side of the flipped chip. A heat sink, with (capped) or without (capless) a heat spreader or cap has been used to facilitate heat removal from the opposed side of the chip. Alternatively, the back or opposed side of the chip can be manufactured exposed allowing thermal transfer through a later applied customer heat sink to the opposed side of the chip. Examples, of flip chip encapsulation using capless and capped approaches are proposed in a publication entitled "Ball Grid Array Technology " by John H. Lau, pages 137 –138. U.S. Pat. Nos. 5,399,898; 5,410,805: 5,637,920; and 5,700,723, assigned to the assignee of the present invention and incorporated herein by reference for all purposes, also disclose flip chips. U.S. Pat. No. 5,638,920 discloses a ball grid array for a flip chip.

Also, U.S. Pat. Nos. 5,514,327; 5,527,743; and 5,552,634 disclose a heat sink and U.S. Pat. Nos. 5,463,529 and 5,568,683 disclose both a heat sink and a heat spreader. These patents are also assigned to the assignee of the present invention and incorporated herein by reference for all purposes.

Amkor Electronics of Santa Clara, Calif. has fabricated chips attached, in some cases by an epoxy, to a substrate with the chip active electrcial circuitry side facing upward (away from the top of the substrate). Wire bonds are then attached between the circuitry on the active side of the chip and the substrate to electrically connect the chip and substrate. A material or compound that resists electrcial conductivity but, preferably, is thermally conductive, completely covers the wire bonds to electrically isolate the wire bonds.

LSI Logic Corporation of Milpitas, Calif., the assignee of the present invention, has constructed a flip chip package, such as shown in FIG. 1. In the flip chip package, a substrate 10 is a top 10A and a bottom 10B. The organic material for substrate 10 is preferably fabricated from a bismaleimide triazine (BT) resin supplied by Mitsubishi Gas Chemical and Allied Signal. However, other substrates fabricated from aluminum-nitride (AlN); silicon-carbide (SiC), glass-ceramic silicon (Si), glass epoxy, and polymide have been used. A silicon ship 12 has an active side 12A with electrical circuitry and an opposed side 12B. The active side 12A of the chip 12 is electrically connected or bonded to the top surface 10A of substrate 10 by reflowed solder bumps 14, preferably fabricated with a composition of 63% tin and 37% lead (63 Sn -37 Pb). These solder bumps 14, provide the electrical connection of the chip 12 to the substrate 10. However, solderless bumps have been proposed, such as disclosed in the paper entitiled "Fabrication and Assembly Processes for Solderless Flip Chip Assemblies" by Richard H. Estes of Epoxy Technology, ISHM '92 Proceedings (pages 322–335). As discussed below in detail, an underfill 16 is applied using capillary action after bump connection of the chip 12 to the substrate 10 is completed. Like the material or compound used to cover the wire bonds discussed above, this underfill 16 resists electrical conductivity but, preferably is thermally conductive.

A prior art stiffener 18, such as disclosed in the Background of the Invention section of U.S. patent application Ser. No. 08/994,391 filed on Dec. 19, 1997, entitled "Flip Chip Stiffener with Circular Notches in Inner Opening and Predispensed Adhesive" has been used. This U.S. application is also assigned to the assignee of the present invention and is incorporated herein by reference. Generally, the prior art stiffener 18 has an inner window or opening formed by four sides, each inner side having a distance of 22.00 millimeters ±0.10 millimeter, a distance from the squared outer edges of 4.00 millimeters ±0.10 millimeters and a thickness of 0.5 millimeter ±0.05 millimeter.

In particular, the underfill 16 comprises an epoxy that is dispensed during assembly and allowed to cure. After the underfill 16 has cured, if a heat spreader is used, such as the heat spreader 20, an additional epoxy, such as an electrically/thermally conductive paste 22, Product No. 8361H, sold under a trademark "ABLEBOND" by Ablestick Electronic Materials & Adhesives of Rancho Dominguez, Calif., a subsidiary of National Starch and Chemical Company is used. The conductive paste 22 is applied between both the opposed side 12B of the chip 12 and the stiffener 18, and the heat spreader 20 during the assembly and allowed to cure. A thermal grease has also been used between the opposed side 12B of the chip 12 and the heat spreader 20 instead of paste 22. A heat sink, not shown, can be attached to the heat spreader of FIG. 1 with a conductive adhesive. An array of balls, such as balls 24, as shown in FIG. 1, are then attached to the bottom 10B of the substrate 10.

The heat spreader 20 and the stiffener 18 are preferably fabricated from a nickel plated copper. Since the chip 12 is attached to the heat spreader 20 using the thermal paste 22, the thermal conduction path travels from the chip 12 back or opposed side 12B through the thermal paste 22, the heat spreader 20, a stiffener attach material 18B, such as the thermal paste 22, and the stiffener 18. As can now be understood, dispensing and curing of the epoxy 18A, 18B for attaching the stiffener 18 to both the heat spreader 20 and substrate 10, and the dispensing and curing of the epoxy 22 for attaching the silicon chip 12 to the heat spreader 20 results in additional material and processing cost. Also, maintaining the gap between the chip 12 and the heat spreader 20 for consistent thermal conduction is a concern. Also, the copper heat spreader 20 and the nickel plated copper stiffener 18 account for significant amount of weight and cost in the package of FIG. 1.

Turning to FIG. 2, another package, presently being used in the industry, does not include a stiffener, such as stiffener 18, or a heat spreader, such as heat spreader 20, as shown in FIG. 1. While this package would be lower in cost than the flip chip package shown in FIG. 1, the main thermal path for heat dissipation is through the bumps 14 on the downwardly facing active side 12A of the chip 12. Also, the opposed side 12B of the chip 12 of FIG. 2 may have a relatively thin protective coating on the opposed side 12B.

As is known, the chip 12 and its interconnection to the substrate 10, as shown in both FIGS. 1 and 2, by the bumps 14 must be protected by encapsulation using an underfill 16 resistive to electrical conductivity. In the past a filled epoxy resin underfill 16 has been used to seal between the chip 12 and the substrate 10 immediately after bonding. The sealing resin is then usually cured at 150° C. As discussed above, the encapsulate underfill 16 flow occurs by capillary action under the chip 12 and is complete when fillets form along all four sides of the chip 12, as partially shown by the fillet F in FIGS. 1 and 2. Preferably, a silica filed epoxy resin encapsulate underfill 16 is dispensed around the bumps 14. A silicon-carbon liquid encapsulate introduced by Hercules, Incorporated of Wilmington, Delaware has been found to have excellent moisture resistance, ionic purity, low dielectric constant and good thermal properties, as proposed in the publication entitled "Flip Chip Technology—A Review" by Chien-Yi Huang and K. Srihari, Phd., November 1994. Generally, the underfill 16 volume required is a function of the chip size, number of bumps, size of fillet around the perimeter of the chip and the stand-off height between the chip 12 and the substrate 10. Typically, less than 0.1 gram of underfill 16 is sufficient. A gel step for the underfill 16 is often performed for ease of handling before an oven cure to prevent further moisture absorption.

As mentioned above, U.S. Pat. No. 5,700,723, previously incorporated herein by reference, proposes a method of packaging an integrated circuit, preferably a flip chip. In one embodiment, a form is used in molding a single compound for both the underfill and to cover the chip and a portion of the top of the substrate, as depicted in FIGS. 4 and 7 of the '723 patent. The compound is preferably a heat conductive material, such as an epoxy, and because a single compound is used, the compound must resist electrical conductivity to isolate the bumps and their contacts. ('723 patent, col. 3, lns 31–45).

U.S. Pat. No. 5,572,069, which is assigned to the assignee of the present invention and is incorporated herein by reference for all purposes, proposes screen printing a conductive epoxy onto a printed wire board (PWB).

SUMMARY OF THE INVENTION

An electronic device or flip chip includes a chip having an active side and an opposed side, with the active side electrically connected by bumps with the top of a substrate. A first material or underfill, generally located between the chip and the substrate, is resistive to electrical conductivity to isolate the flip chip bumps and their contacts. A second electrically conductive material is formed on a portion of the top of the substrate, the opposed side of the chip and over the first material to completely cover and protect the opposed side. The second material preferably has 80–95% metal fillers and is at least 75 microns (0.075 millimeters) thick. The second thermally/electrically conductive material transfers heat from the opposed or back side of the chip to provide a low cost flip chip package with comparable thermal performance to a flip chip with a heat spreader and a stiffener. Savings in cost of materials and processing is achieved by the elimination of at least the heat spreader and, when desired, the stiffener.

BRIEF DESCRIPTION OF THE DRAWINGS

A better understanding of the present invention can be obtained when the following detailed description of the preferred embodiment is considered in conjunction with the following drawings, in which:

FIG. 1 is a partial elevational view of a flip chip package used in the past having a stiffener and a heat spreader;

FIG. 2 is a view similar to FIG. 1 of a flip chip package used in the past where the stiffener and heat spreader have been eliminated and a protective coating is formed on the back or opposed side of the chip;

FIG. 3 is a view similar to FIG. 1 of a flip chip package of the present invention including an electrically conductive material formed parallel to the top of the substrate and above the opposed side of the chip and a portion of the substrate;

FIG. 4 is a view similar to FIG. 1 of a flip chip package of the present invention where an electrically conductive material has a constant thickness on both the opposed side of the chip and a portion of the top of the substrate; and FIG. 5 is a view similar to FIG. 1 of an alternative embodiment of the present invention where an electrically conductive material covers the top of the opposed side of the chip in the cavity created in the window of a flip chip stiffener.

DETAILED DESCRIPTION OF THE PREFERRED EMBODIMENT

Turning now to FIGS. 3 and 4, instead of using a material resistive to electrical conduction, as discussed above, a electrically/thermally conductive material, such as an epoxy, as discussed below, is used to cover the opposed side 12B of the chip 12 and a portion of the top 10A of the substrate 10.

After the chip 12 has been electrically connected by bumps 28 to the substrate 10, an underfill 26 resistive to electrical conductivity, such as the above discussed silicon-carbon filled liquid encapsulate sold by Hercules, Incorporated of Wilmington, Del., is applied by capillary action to isolate the active electrical circuitry of the chip 12 and the solder balls 40, as discussed below in detail. The soldermask on the top 10A of the substrate 10 also serves the function to electrically isolate the signals between the chip 12 and the substrate 10.

According to the present invention, a preferred electrically/thermally conductive epoxy 30, typically loaded with metal fillers such as copper, aluminum nitride, or silver flakes, is formed on the opposed side 12B of the chip 12 and a portion of the substrate 10. The amount of filler used is preferably in the range of 80–95%. In the preferred embodiment, shown in FIG. 3, the top surface 30A of the conductive material 30 is substantially parallel with the top 10A of said substrate 10 while covering a portion of the substrate 10 and all of the opposed side 12B of the chip 12.

Turning now to FIG. 4, the material 30 is formed on, and has a substantially uniform thickness above a portion of the top 10A of the substrate 10 and all of the opposed side 12B of the chip 12.

Preferably, in the embodiments of both FIGS. 3 and 4, the material 30 is between 75 microns (0.075 millimeters) and 250 microns (0.25 millimeters) in thickness. By using the conductive material 30 instead of the nickel plated copper stiffener 18 and the copper heat spreader, such as shown in FIG. 1, a thermal performance enhanced over the prior art package as shown in FIG. 2 will be realized, without the cost and weight of the prior art package shown in FIG. 1. While the thermal performance of the present invention will not be as good as the prior art package as shown in FIG. 1 with a heat spreader 20, particularly when a heat sink is attached to the heat spreader 20, as disclosed in U.S. Pat. Nos. 5,463, 529 and 5,568,683, the package of the present invention will be lower in cost with comparable thermal performance. Also, because a less expensive material 30 is used instead of underfill 26 that is required to resist electrically conduction, a reduction in cost of materials is realized. Also, the packages of FIGS. 3 and 4 will be lighter in weight because of the elimination of the heat spreader and stiffener. Also, advantageously, the finished surface 30A in both FIGS. 3 and 4 will allow for marking directly on the flip chip package.

Turning now to FIG. 5, an alternative embodiment is shown using a stiffener 32, attached to the substrate 10. After the chip 12 has been attached to the substrate 10 with the bumps 34, and the underfill 36, similar to underfill 26 resistive to electrical conduction, applied, an electrically/thermally conductive cavity fill 38 is used, instead of a heat spreader, to reduce cost. Preferably, the same material for conductive material 30 is also used for the cavity fill 38. Like the material 30, the cavity fill can be dispensed immediately after the underfill has sufficiently gelled and both the underfill and the cavity fill can be cured at the same time. The finished surface 38A will also allow for marking directly on the flip chip package.

Packaging Process

The process of forming material 30 in FIG. 3 is by molding, similar to molding process for plastic ball grid arrays (PBGA) or as proposed in U.S. Pat. No. 5,700,723. In the preferred molding process, the chip 12 will be attached by bumps 28 to the substrate 10 and the underfill allowed to flow by capillary action between the attached bumps until the fillets F are formed on all four sides of chip 12 to electrically isolate the package. The underfill is then allowed to sufficiently gel. The less expensive conductive material 30, with approximately 80–95% of metal fillers such as copper, aluminum nitride or silver flakes, will then be molded in a desired thickness and allowed to cure with the underfill. The volume and amount of materials will be adjusted based on thermal needs, dimensional form factors, cost and other variables.

After the underfill and electrically conductive material have cured, an array of balls, such as the balls 40, will be attached to the bottom 10B of the substrate 10. Marking of the package can then be performed on the top surface and tests performed, as is known by those skilled in the art.

Alternatively, after the underfill has sufficiently gelled, where molding is not feasible, for example, because of the viscosity of the material or cavity fill used, a stencil printing process can be used, instead of molding. In this process, a stencil is configured to define the geometry of the material. The thickness of the stencil will define the final height of the package. The typical thickness of the epoxy on top of the silicon chip 12 will be 75 microns (0.075 millimeters) to 250 microns (0.25 millimeters). The material or cavity fill is pushed across the surface of the stencil with a blade, the electrically conductive material or cavity fill fills in the area formed by the stencil dimensions. The stencil is then lifted and the electrically conductive material or cavity fill allowed to cure with the underfill. This stencil printing process can be used for the embodiments of FIGS. 3, 4 and 5.

Also, after the underfill has sufficiently gelled, a screen printing process may be used to obtain a thin coating (between 75 to 250 microns) of the electrically conductive material 30 or fill 38 on opposed side 12B of the chip 12 and substrate 10. This is a standard screen printing process where a flexible screen is used to define the region for material disposition. This screen printing process can be used for the embodiments of FIGS. 3, 4 and 5.

Other liquid epoxy dispense means contemplated for applying the material 30 for the embodiments of FIGS. 3, 4 or 5 include sputtering, where a thin metal coating is sputtered to the opposed side 12B of the chip 12 and a portion of the substrate 10, after the chip 12 is attached to the substrate 10, and the underfill applied and sufficiently gelled. Also, after the underfill has sufficiently gelled, an air brush/spray process could be used where the material would be sprayed onto the opposed side 12B of the chip 12 and a portion of the substrate 10. The metal fillers could be sized and mixed into the epoxy to allow for the thin film coating. Also, a roller process could be used for applying a thin coating of the material by roller that contains the conductive fillers sized for this process, similar to the air brush/spray process.

The sputtering, air brush/spray and roller processes will advantageously provide a rough surface that will enhance thermal dissipation due to the increased surface area, thereby improving thermal performance without adding significantly to the cost.

The foregoing disclosure and description of the invention are illustrative and explanatory thereof, and various changes in the details of the illustrated apparatus and construction and method of operation may be made without departing from the spirit of the invention.

What is claimed is:

1. An electronic device, comprising:
   a substrate having a top and a bottom,
   a chip having a perimeter and having an active side facing said top of said substrate and an opposed side, said perimeter between said active side and said opposed side, said active side electrically connected with said top of said substrate,
   a first material resistive to electrical conduction disposed between said chip active side and said top of said substrate, and
   a second electrically conductive material formed on a portion of said top of said substrate, the second electrically conductive material surrounding the chip around said chip perimeter and substantially covering said opposed side of said chip.

2. Electronic device of claim 1 further comprising bumps for electrically connecting said substrate with said chip.

3. Electronic device of claim 1 further comprising a fillet formed around said chip when the first material is disposed between said top of said substrate and said active side of said chip.

4. Electronic device of claim 1 wherein said second material is thermally conductive.

5. Electronic device of claim 4 wherein said second material comprises an epoxy.

6. Electronic device of claim 1 wherein said first material and second material are thermally conductive.

7. Electronic device of claim 1 wherein said second material includes between 80 to 95 percent metal fillers.

8. Electronic device of claim 6 wherein said second material disposed on said opposed side of said chip is at least 75 microns (0.075 millimeters) thick.

9. Electronic device of claim 8 wherein said second material is between 75 to 250 microns thick.

10. Electronic device of claim 8 wherein said second material has a substantially uniform thickness along said top of said substrate and said opposed side of said chip.

11. Electronic device of claim 8 further comprising a top surface of said second material wherein said top surface of said material is substantially parallel with the top of said substrate while covering a portion of said substrate and said opposed side of said chip.

12. The electronic device of claim 1 wherein said second material is in contact with the chip at each point of said perimeter.

13. An electronic device, comprising a substrate having a top and a bottom, a chip having an active side facing said top of said substrate and an opposed side, said active side electrically connected with said top of said substrate, a first material resistive to electrical conduction disposed between said chip active side and said top of said substrate, a second electrically conductive material formed on a portion of said top of said substrate and said opposed side of said chip, and a stiffener having an opening and positioned on said substrate, and said chip positioned within said stiffener opening.

14. Electronic device of claim 13 wherein said second material is disposed in said stiffener opening.

15. An electronic device, comprising:

a substrate having a top and bottom;

a chip having an active side facing the top of the substrate and an opposed side, said active side electrically connected with said top of said substrate, the chip having outer side walls that connect the active side and the opposed side, and a monolithic electrically and thermally conductive material formed on said opposed side of said chip and on said substrate such that it surrounds the side walls of said chip.

16. The electronic device of claim 15 wherein said conductive material is in contact with the side walls and completely covers the side walls.

17. An electronic device, comprising a substrate having a top and a bottom, a chip having an active side facing said top of said substrate and an opposed side, said active side electrically connected with said top of said substrate, a first material resistive to electrical conduction disposed between said chip active side and said top of said substrate, and a second electrically conductive material formed on a portion of said top of said substrate around said chip and said opposed side of said chip wherein said second material includes between 80 to 95 percent metal fillers.

* * * * *